United States Patent [19]

Cordell

[11] Patent Number: 4,773,085
[45] Date of Patent: Sep. 20, 1988

[54] PHASE AND FREQUENCY DETECTOR CIRCUITS

[75] Inventor: Robert R. Cordell, Tinton Falls, N.J.

[73] Assignee: Bell Communications Research, Inc., Livingston, N.J.

[21] Appl. No.: 62,494

[22] Filed: Jun. 12, 1987

[51] Int. Cl.$^4$ ............................................. H03D 3/24
[52] U.S. Cl. .................................. 375/120; 331/1 A; 331/25; 307/523
[58] Field of Search ............... 375/111, 118, 119, 120; 331/1 A, 25; 307/510, 522, 523

[56] References Cited

U.S. PATENT DOCUMENTS

| | | | |
|---|---|---|---|
| 3,714,463 | 1/1973 | Laune | 307/232 |
| 4,015,083 | 3/1977 | Bellisio | 178/69 |
| 4,200,845 | 4/1980 | Mendenhall et al. | 331/1 A |
| 4,594,564 | 6/1986 | Yarborough, Jr. | 331/1 A |
| 4,611,230 | 9/1986 | Nienaber | 375/120 X |
| 4,627,080 | 12/1986 | Debus, Jr. | 375/119 X |

Primary Examiner—A. D. Pellinen
Assistant Examiner—Derek S. Jennings
Attorney, Agent, or Firm—James W. Falk; Stephen M. Gurey

[57] ABSTRACT

A Phase/Frequency Locked Loop comprises a controllable oscillator which is phase locked with the clock of an incoming non-return-to-zero digital data signal. The controllable oscillator may be a voltage-controlled oscillator (VCO) or may be purely digital. The circuitry includes a novel digital phase and frequency detector which detects both frequency and phase error by sampling the incoming data stream at multiple phases of the output of the VCO (or the digital equivalent thereof). One of two binary disagreement signals are produced depending on the sense of the phase error. During periods of frequency error, the circuit automatically selects the proper type of disagreement signal (the leading-edge disagreement) required to achieve frequency lock.

15 Claims, 7 Drawing Sheets

PHASE AND FREQUENCY DETECTOR CIRCUITS

BACKGROUND OF THE INVENTION

This invention relates to circuitry useful, for example, in digital transmission systems for recovering the clock from an incoming non-return-to-zero (NRZ) digital data stream. Such data streams will have transition densities which vary with the intelligence being transmitted and also with the statistically varying scrambling pattern applied to the intelligence signal at the transmitter. A transition is a change in voltage level of the data stream when the signal changes binary state, and transition density is the number of transitions as a percentage of the total number of time slots. Strings of binary 1s or 0s will produce no voltage changes or transitions. Most phase and frequency detectors which are parts of phase locked loops depend on the periodic nature of the incoming signal to provide information about its frequency and phase. The aforementioned NRZ signals with varying transition density do not have this regularly recurring or periodic feature, which would facilitate the extraction of the phase and frequency information therefrom. For this reason specialized circuitry must be utilized for phase/frequency locked loops used with NRZ signals.

A phase locked loop is a circuit for locking the phase of a local voltage controlled oscillator (VCO) with an input signal which may be varying in frequency and/or phase and may contain noise. Phase locked loops may be used as demodulators for phase shift keyed binary signals or they may be used to track a phase or frequency varying input, for example, to recover the clock of an incoming digital data signal. When used to track a carrier signal the phase locked loop may be thought of as a narrow band filter for removing noise and thus generating a clean replica of the carrier. A simple phase locked loop comprises a phase detector to which the input signal and the output of a VCO are applied, with the phase detector output applied to the frequency control element of the VCO via a low pass filter. The hold-in range of such a circuit is the maximum change in input frequency for which the loop will remain locked. This is governed by the dc gain of the loop and the frequency control range of the VCO. As the input frequency changes, the phase error will continually increase until the loop unlocks and the phase detector produces an ac beat note output. The pull-in range is the range of frequencies which the loop will lock to if it is initially unlocked. If the two frequencies applied to the phase detector are close enough, the feedback loop will contain a dc component which will cause the VCO to move toward frequency and phase lock. The loop bandwidth is the range of frequencies of phase jitter which will pass through the loop with relatively little attenuation. A narrow loop bandwidth is required to reduce phase jitter in the VCO output, but this severely restricts the pull-in range. Prior art methods used to achieve phase lock or acquisition have included compromises in loop filter design, highly accurate VCOs, sweeping VCOs and loop filters which can be switched from wide to narrow bandwidth after phase lock has been achieved. An example of this latter method is the circuit of U.S. Pat. No. 4,200,845, issued to Mendenhall et al. on Apr. 29, 1980. Another technique is to use a frequency detector in addition to the phase detector, wherein the frequency detector generates a frequency error signal proportional to the frequency difference between the input and VCO frequencies, and this error signal drives the VCO toward the input frequency. When the frequency error is small, the phase detector will start to generate a dc phase error signal which produces and maintains phase lock. With this circuitry, the loop bandwidth can be small and the pull-in range large.

The prior art includes digital phase/frequency locked loops wherein separate frequency and phase detectors jointly control the VCO, as explained above, however, most of these prior art circuits are not designed to function with input NRZ signals of the types described above; such circuits require a periodic input signal with regularly recurrent transitions. Examples of such prior art digital phase/frequency locked loops are shown in U.S. Pat. Nos. 3,714,463 issued to Laune on Jan. 30, 1973 and 4,594,564 issued to Yarborough on June 10, 1986.

The present invention is useful as part of synchronizing circuitry for digital transmission systems wherein numerous digital channels are required to be phase synchronized (or aligned) with a locally generated master clock at a terminal or repeater. The different channels and the local clock will all have the same long term synchronous frequency but the incoming channels may have randomly varying phases caused, for example, by the traversal of different transmission media with different propagational velocities and/or different distances. Also, upon switch-on or following a supply voltage surge, the VCO may be temporarily out of phase lock and may therefore require frequency correction. The synchronization of such channels facilitates the synchronous processing of these signals, since all of the terminal or repeater processing circuitry can operate from a single master clock to which all incoming signals have been synchronized.

In my co-pending application entitled "Digital Phase Aligner", Serial No. 946,323, filed on Dec. 24, 1986, which issued on Jul. 5, 1988 as U.S. Pat. No. 4,756,011, novel circuitry is disclosed and claimed for achieving such synchronization or phase alignment by sampling each of the incoming data streams at four points (0°, 90°, 180°, and 270°) of the local clock and wherein the in-phase (0°) and anti-phase (180°) samples are loaded into different halves of a bi-phase register, which is clocked by the local clock. As the data stream and local clock vary in phase, a logic circuit detects such phase variations by logic analysis of the aforementioned four samples and in response thereto automatically selects one of the stages of the bi-phase register for connection to the output, so that no data is lost. The output is thus a delayed replica of the input data stream but at the bit rate of the local clock.

A different known technique for achieving phase alignment of such phase-varying synchronous digital data streams involves the use of a FIFO (first-in, first-out) register wherein the incoming data stream is clocked into one end of the FIFO and the locally generated master clock is used to clock the data out of the other end thereof. Phase variations between the incoming data stream and the local master clock will cause the FIFO to fill up or become depleted, but the system is designed so that the FIFO is never fully depleted and never overflows. In such a system, if the incoming data does not have a clock signal, which is the usual case, it is necessary to recover the incoming clock of each channel from the data stream thereof with a phase/frequency locked loop. The recovered clock is then used to clock the data into the FIFO. The circuit of the present invention is such a phase/frequency locked loop.

SUMMARY OF THE INVENTION

Briefly stated, my novel phase and frequency locked loop comprises a VCO which is phase locked with the clock of an incoming NRZ data stream. The VCO output is thus the recovered clock of the data stream. The locked loop comprises novel digital logical circuitry which acts during phase lock functions as a phase detector, and during periods of frequency error (when the phase detector cannot function to achieve phase lock) the circuitry automatically becomes a frequency detector to provide a frequency error signal which drives the VCO toward phase lock.

The aforementioned digital logic circuitry comprises a phase and frequency detector which detects both frequency and phase error by sampling the incoming data stream at multiple phases of the output of the VCO. Exclusive-Or gates are used to detect disagreements between adjacent samples, such disagreements indicating that a transition had occurred between the taking of the samples and also indicating frequency and phase error and the sense thereof.

During phase lock all of the sampling points employed by the frequency detector portion will remain fixed within each data eye or time slot and there will be no disagreements among these samples. Phase drift will produce a disagreement as one or the other of the samples crosses a data transition. The sense or direction of the phase drift depends on which sample pair produces the disagreement signals, and these signals comprise the coarse phase error signals which are used to change the VCO frequency in such a direction as to achieve phase lock. When phase error is reduced below a certain level, the disagreement signals will no longer occur. When phase lock is lost for any reason, the resultant frequency error will cause a rapid succession of the aforementioned phase error disagreement signals which will alternate between signals which tend to increase and decrease the VCO frequency. Thus little or no net frequency control will result. During such frequency error, the sample points continually drift through the data windows (or eyes) and pass through "quiet" periods during which there are data transitions but no disagreements when the sample points are all temporarily within an eye, followed by disagreements as an eye border or transition is crossed. As a quiet period is exited and a period of disagreements entered, the first or leading-edge disagreements represent the proper frequency error sense. In accordance with an aspect of my invention, the phase and frequency detector comprises means to detect such leading-edge disagreements and in response thereto to suppress all the opposite or trailing-edge disagreements. Thus the leading-edge disagreements form the frequency error signal which drives the VCO toward phase lock.

The circuit also comprises an auxiliary phase detector feedback loop which maintains a sample point at or near all of the data transitions. This auxiliary loop thus provides increased phase accuracy or fine tuning during phase lock.

It is thus an object of this invention to provide a digital phase/frequency locked loop which is capable of recovering the clock of NRZ digital data streams.

Another object of the invention is to provide a digital phase/frequency locked loop comprising a VCO which is frequency and/or phase locked to the clock of an incoming NRZ digital data stream by means of a phase and frequency detector which comprises means to sample the incoming data stream at multiple phases of the VCO, means to produce one of two different disagreement signals depending on the sense of the phase error between the VCO and the data stream, means to achieve phase lock by applying the disagreement signal to said VCO, and means during periods of frequency error to detect the leading-edge disagreement signal and to suppress the opposite or trailing-edge disagreement signals, whereby the leading-edge signals will drive the VCO toward phase lock.

A further object of the invention is to provide a frequency/phase locked loop capable of recovering the clock of a digital data stream by producing frequency and/or phase disagreement signals derived from adjacent pairs of samples of said data stream which are derived from multiple phases of a local clock.

A still further object is to provide an all digital phase/frequency locked loop which can be easily implemented with VSLI technology. U.S. Pat. No. 4,015,083 issued to Jules Bellisio on Mar. 29, 1977 discloses a circuit comprising a phase/frequency locked loop used to recover the clock of an incoming NRZ data signal; however that patent utilizes analog circuitry which is not amenable to VSLI implementation.

Another object of the invention is to provide a circuit comprising a phase and frequency detector and a VCO which is controlled by the output of the detector, the detector comprising means to sense phase and frequency error between the output of the VCO and an incoming NRZ digital data signal applied to the detector by detecting disagreements between two different pairs of samples of the incoming data stream taken at different phases of said VCO and means to control the frequency/phase of the VCO in response to the disagreements. The phase and frequency detector further comprises an auxiliary phase control circuit which provides auxiliary phase control signals to the VCO in response to the phase of the transitions of the incoming data stream relative to a given fixed phase of the VCO.

Another object of the invention is to provide a digital phase/frequency detector which produces outputs related to the phase and frequency difference between an input NRZ digital data signal and the output of a VCO, the digital phase and frequency detector output controlling the VCO frequency in such a way that the frequency and phase of the VCO and the NRZ signal are synchronized.

Another object of the invention is to provide a digital phase and frequency detector of the type described which is useful in circuits other than the phase/frequency locked loops described herein.

These and other objects and advantages of the invention will become apparent from the following detailed description and the drawing.

DETAILED DESCRIPTION

Figure 1:
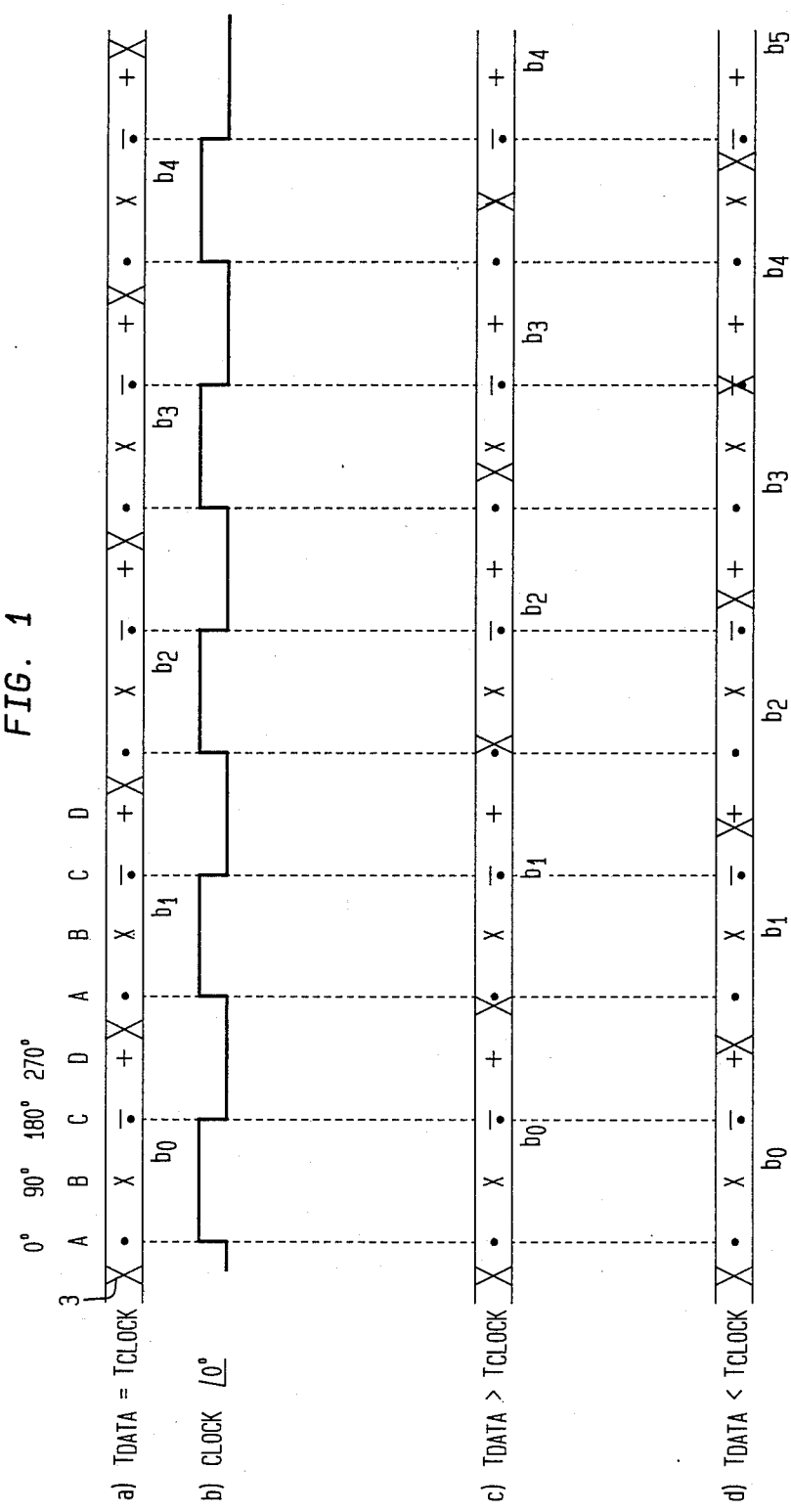
FIG. 1 depicts waveforms illustrating multiple sampling of the data stream at four phases of the local clock (or VCO).

The phase/frequency locked loop comprises a phase and frequency detector to which the incoming data stream is applied, plus a voltage controlled oscillator (VCO), the frequency of which is controlled by the output of the detector. The detector comprises a quartet sampler which samples the incoming data stream at four quadrature points, e.g., at 0°, 90°, 180°, and 270° of the local clock (which is the VCO) by means of four D-type flip-flops. The resultant samples are time-aligned by means of four additional similar flip-flops clocked at 0°. The time-aligned data samples are denoted A, B, C, and D corresponding to the sampling points of 0, 90, 180 and 270 degrees, respectively. The A and B samples are compared in an Exclusive-Or (Ex-Or) gate to yield a disagreement signal W and similarly another Ex-Or gate produces an X disagreement signal from the samples B and C. The current B sample and the B sample of the previous time slot are applied to another Ex-Or gate to yield a signal $V_n$ indicating the presence or absence of a data transition. The W, X and V signals are applied to a logic circuit which produces either a pump-up (or $f_{up}$) signal or a pump-down (or $f_{down}$) signal for application to the frequency control element of the VCO, depending on the sense of the frequency or phase error.

Assuming the circuit is phase locked and there are transitions, and all three sample points (A-C) are within each data time slot (or eye), no disagreement signals will be produced. If phase drift occurs so that either the A sample point or the C sample point has drifted across a transition, either a W or an X disagreement signal will be produced. This condition represents phase lock with a phase error. Since a drift of the A sample point across its nearest transition results from a high VCO frequency, the W disagreement signal will produce one or more $f_{down}$ pulses which will pump down the VCO frequency until the W signal disappears. Similarly, a drift of the C sample across its nearest transition results from a low VCO frequency and the resultant X disagreement signal will pump up the VCO until the X signals disappear.

When out of phase lock, the resultant frequency error will cause all of the sample points to continually drift through the data eyes (or time slots) going through "quiet" periods of no disagreements when all sample points are temporarily within the data eyes, followed by periods with many disagreements as an eye border (or transition) is crossed. For example, W disagreements will be followed by X disagreements, followed by another quiet period, and so on, when the VCO frequency is too high. An approximately equal number of W and X disagreements are generated, providing no net frequency error bias. However, as each quiet period is exited and a period of disagreements entered, the first or leading-edge disagreements provide the proper sense of frequency error. The phase and frequency detector functions by suppressing the trailing-edge disagreements which create this frequency ambiguity. The quiet periods are detected when there are data transitions indicated by the presence of the aforementioned V signal and the absence of W and X signals. This state of affairs primes the logic circuit to respond to the first W or X disagreement signal which follows the quiet period and to lock out or suppress the opposite disagreement signals until the next quiet period appears. If the selected disagreement signals have not accomplished the frequency correction before the next quiet period, the same cycle repeats.

When phase lock has occurred and there are no more X or W disagreements, the three sample points A, B and C will all be within the data eyes. However, a phase error of up to one quarter of the time slot can occur before corrections will occur with the system as described thus far. In accordance with a further feature of my invention, a third disagreement signal is derived from a third pair of the aforementioned samples and this disagreement signal (Y) is utilized to provide fine phase adjustment of the VCO so that one of the said four sample points (D) is always located at or near a data transition. The third disagreement signal is applied to the feedback loop together with the aforementioned $f_{up}$ and $f_{down}$ signals.

The waveforms of FIG. 1a represent a steam of digital data with the two voltage levels represented by the two horizontal lines, with Xs, such as 3, representing the transitions. The portion of the X which slopes upward toward the right represents a transition from low to high voltage and the oppositely sloped portion of the Xs the opposite transition. FIG. 1a thus resembles an oscilloscope trace of such a signal, both voltage levels being simultaneously visible due to the persistence of the CRT phosphor and of vision. FIG. 1b shows the local clock or VCO output which determines the sample points A-D. These points are identified in this and the following figures by the symbols illustrated in FIG. 1a. The A or 0° point is symbolized by a dot, the b or 90° point by an x, the C or 180° sample by the bar-dot and the D or 270° sample by the plus sign. The A samples coincide with the positive-going transitions of the 0° clock of FIG. 1b, the C samples with the negative going transitions thereof, with the B samples midway between A and C and the D samples midway between the C and the A samples of the following cycle or data eye. As noted in FIG. 1a, the period of the data, $T_{data}$, and the clock, $T_{clock}$, are equal and thus there is no slippage between the sample points and the data transitions. Also, there is no phase error since all of the samples A-D lie within the same data eye. FIG. 1c illustrates the situation wherein the data period is greater than the clock period (clock fast). It can be seen here that the sample points are drifting to the left relative to the data transitions. In FIG. 1d wherein the clock is slow, it is seen that the sample points are moving to the right relative to the transitions. If we focus on the differences or disagreements between time-adjacent samples, information can be derived which can be used for relative phase and frequency detection. The pair of samples between which there is a difference indicates when the local clock period and data transitions are occurring, and this changes with time as the samples drift through the data eyes.

Figure 3:
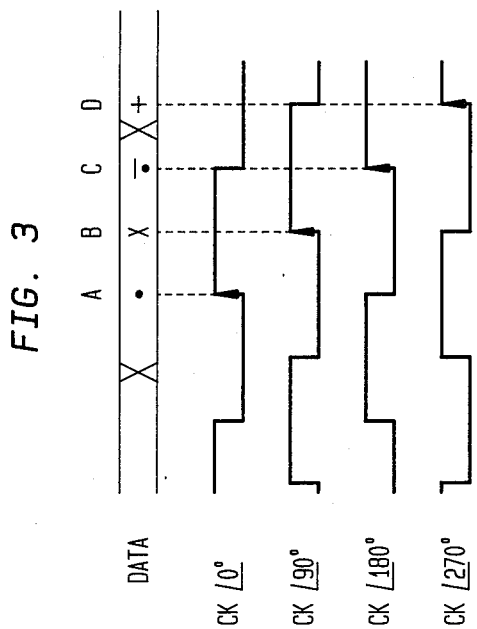
FIG. 3 illustrates the four clock phases used to obtain the four samples of the input data.
Figure 2:
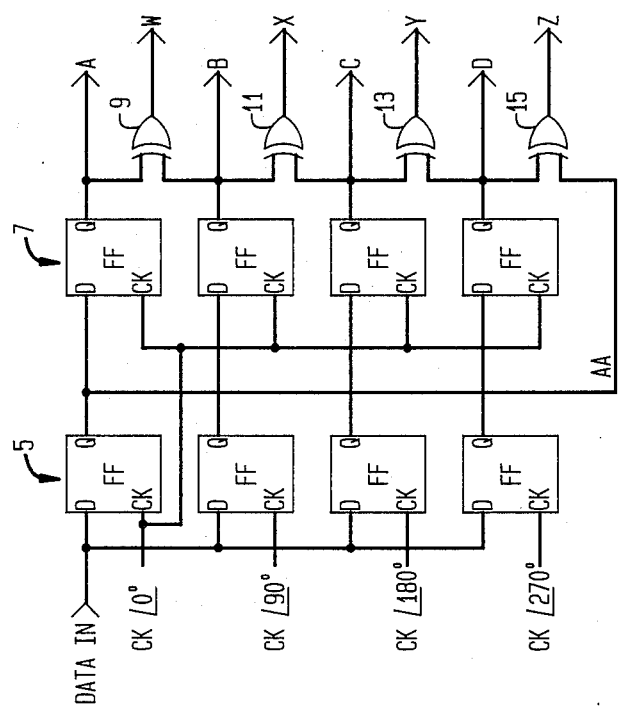
FIG. 2 is the circuit of a quartet sampler used to obtain and time align the samples of the input data.

FIG. 2 shows a quartet sampler which can be used to obtain and time-align four quadrature samples A–D of the input data stream and also to produce four disagreement signals W–Z. The flip-flops of this circuit are all D-types. The flip-flops of a first column 5 do the sampling. The input data stream is connected to all of the D inputs of the flip-flops of column 5 and each one is clocked by a different quadrature phase of the local clock (or VCO). These four clock phases are illustrated in FIG. 3, together with the four sample points within the data stream. As shown therein, the sample points are the positive-going clock transitions. The flip-flops of a second column 7 align the four samples to the 0° phase of the clock, so that these signals can be subsequently processed together. The Q outputs of the second column of flip-flops comprise the four sample signals A–D. The outputs of each adjacent pair of flip-flops are connected to Ex-Or gates 9, 11, 13, and 15 to form the disagreement signals W, X, Y, and Z. Note that these Ex-Or gates will produce an output or binary 1 only if the two inputs thereof are different (or in disagreement) indicating that a transition has occurred between the two sample points, and will produce binary 0 for all other conditions. Note also that the disagreement signal Z is the Exclusive-Or function of the D sample with the A sample (AA) of the next time slot or data eye, which is derived from the output of the top flip-flop of the column 5.

Figure 4:
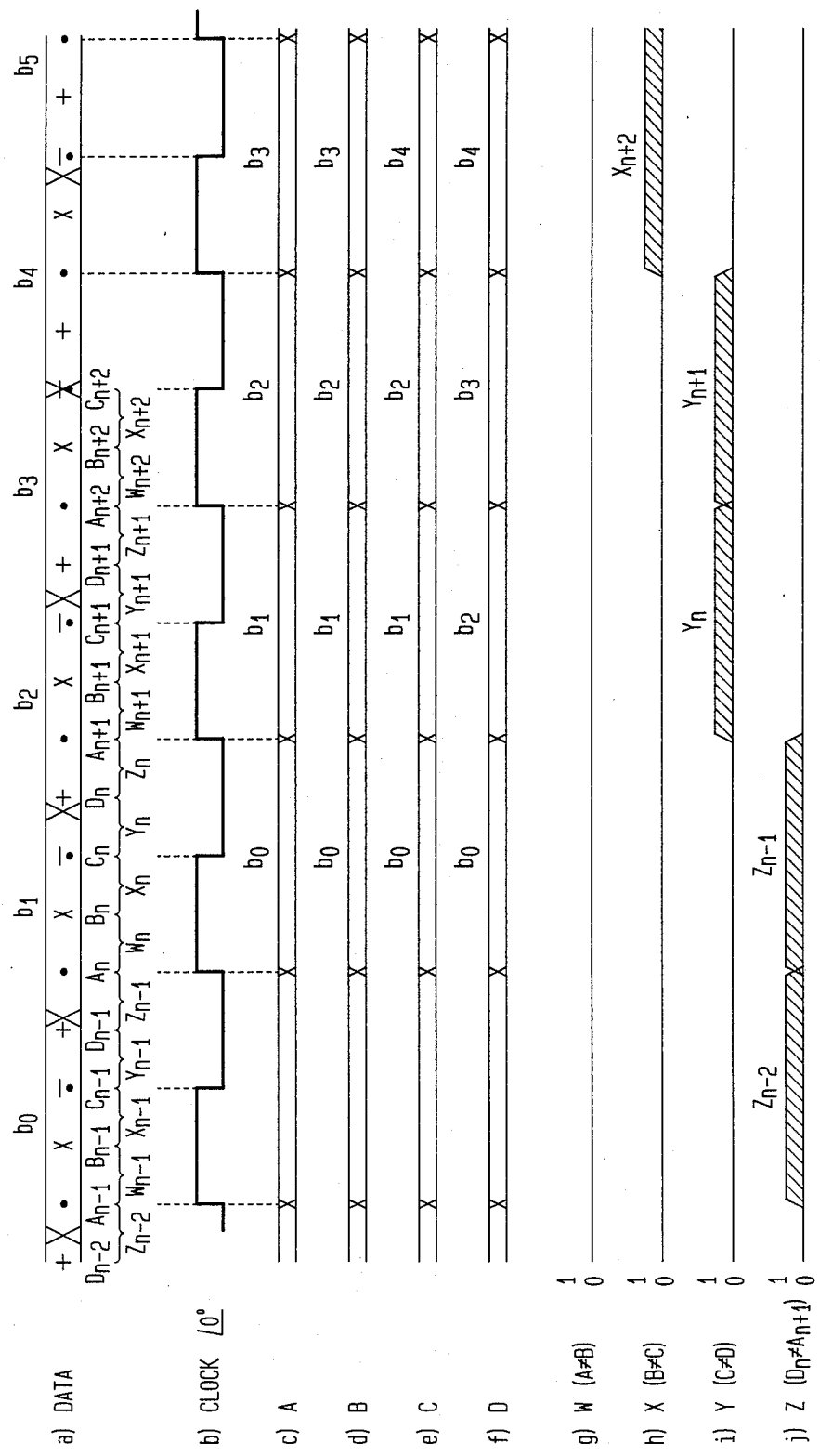
FIG. 4 depicts waveforms illustrating how disagreement signals result from an out-of-lock condition of the VCO.

FIG. 4 illustrates the kinds of disagreements produced when the data period is less than the clock period (clock slow). Thus as shown in FIG. 4a, the samples are drifting to the right within the data eyes. The time slots or data eyes are numbered $b_0$–$b_5$. The waveforms c–f are time-aligned with the 0° clock of line b and show the data eye locations of the sampling points A–D. The time periods where the disagreements occur are indicated by the crosshatched areas of lines g–j. These disagreements will only occur if a data transition separates the two sampling points. It should be noted that as the samples drift to the right through the data eyes because the clock is slow, the disagreements change from Z to Y to X, etc. A fast clock would result in the opposite sequence of disagreements signals, i.e., W, X, Y, and Z, etc.

Figure 5:
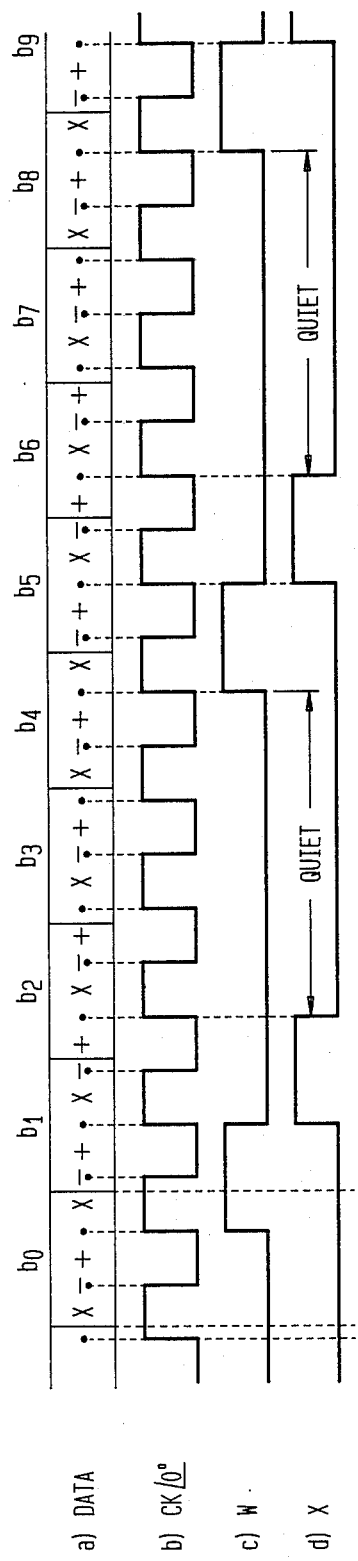
FIG. 5 depicts waveforms illustrating the disagreement signals produced by a frequency error when the data stream has 100% transition density.

FIG. 5 shows how the W and X disagreements are produced when a fast clock is causing the samples to drift to the left through the data, as shown in waveform (or line) a. Notice that the W disagreements precede the X disagreements since a W disagreement occurs whenever the A sample crosses a transition. In waveform a the transitions are denoted by vertical lines and the transition density is 100% indicating that the signal comprises alternating binary 1s and 0s. The first W signal of line c results from the fact that the initial sample of data window $b_0$ is the B sample, and thus the A sample is on the other side of the transition in the preceding data eye. The second W disagreement signal results from the fact that the A and B sampling points straddle the transition between data eyes $b_3$ and $b_4$. If the clock had been slow, the sequence of disagreement signals would be the opposite. The first X disagreement of line d results from the fact that the B and C sampling points straddle the transition between $b_0$ and $b_1$.

Figure 6:
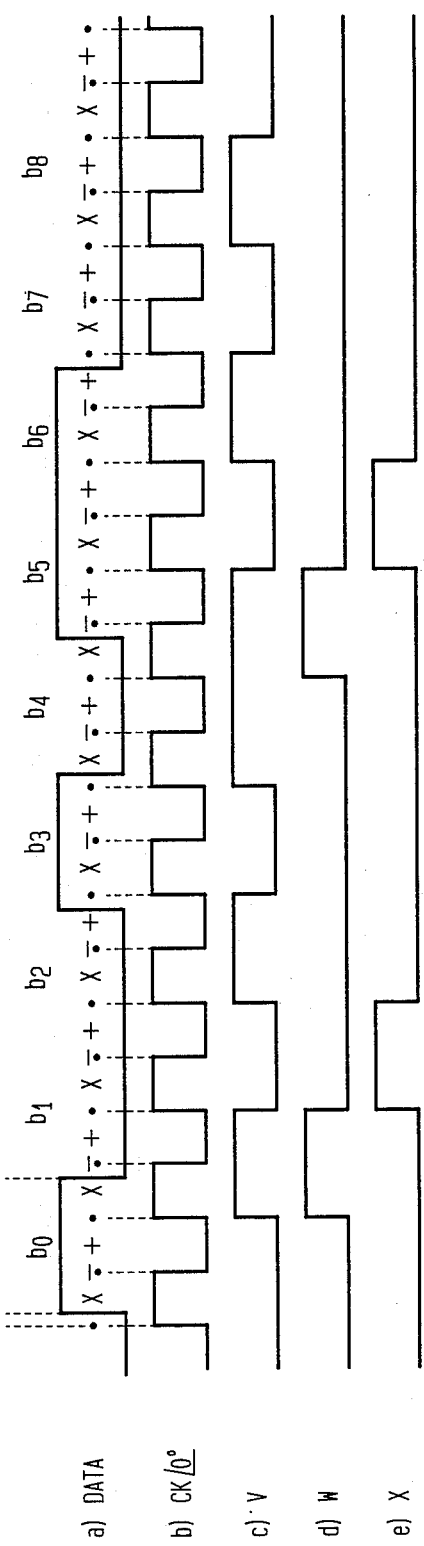
FIG. 6 depicts waveforms illustrating the disagreement signals produced by a frequency error with an actual random data signal applied to the circuit.

FIG. 6 is similar to FIG. 5 but it shows a realistic data stream $b_0$–$b_8$ comprising the binary digits 100101100, wherein the clock is again fast, in fact the clock is very fast so that there is only time for one disagreement signal before the other type disagreement signal appears. With a smaller frequency error, which would be the normal case, several disagreement signals of each type would be produced during each cycle of frequency drift. FIG. 6 also shows the transition signals V, in line c, resulting from adjacent B samples separated by transitions.

Figure 7:
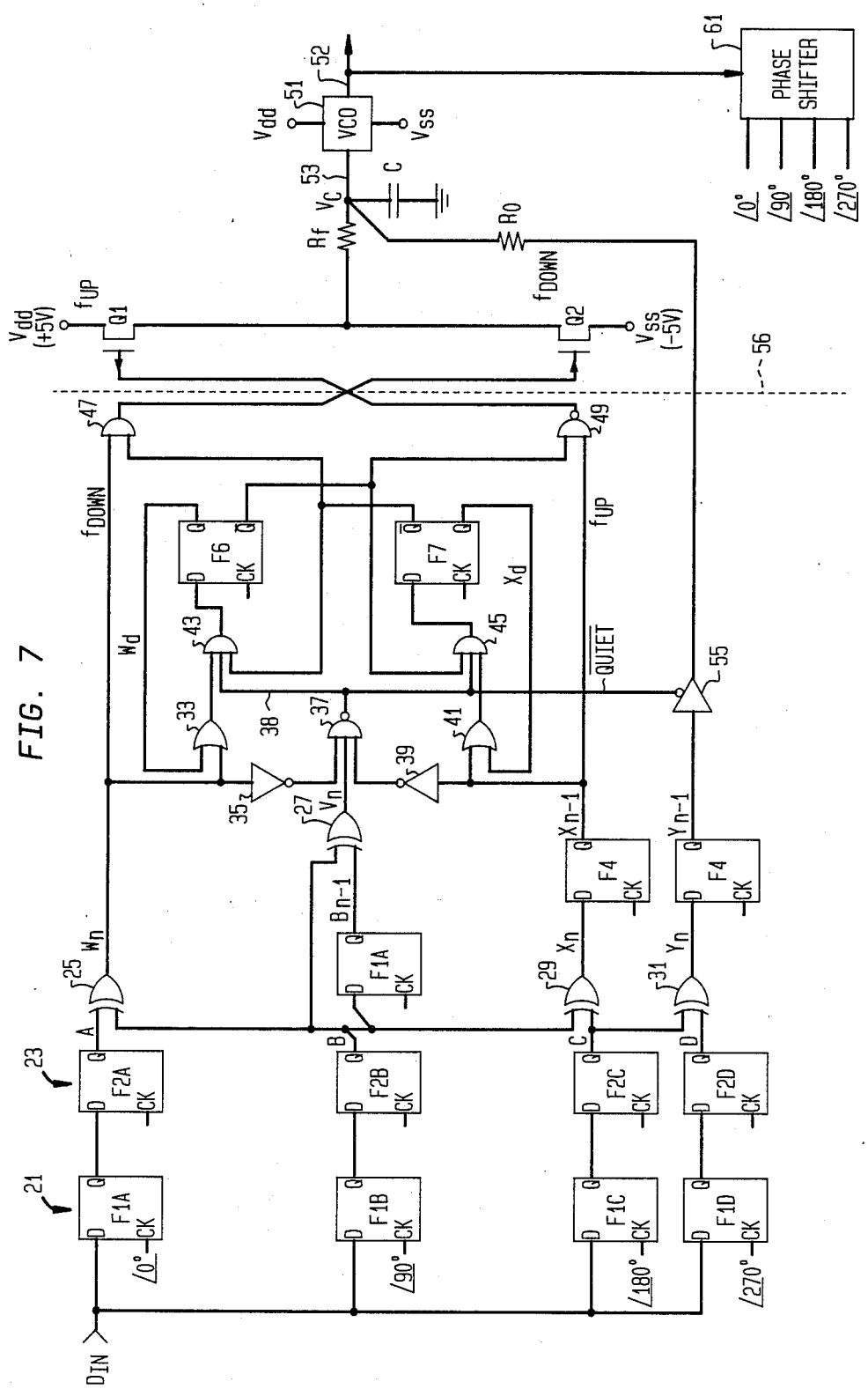
FIG. 7 is a block diagram of one embodiment of the invention.

The circuitry of FIG. 7 is an illustrative phase/frequency locked loop comprising a digital phase and frequency detector, shown to the left of the dashed line 56, a voltage controlled oscillator and associated control and low pass filtering circuitry. The circuitry of FIG. 7 includes a quartet sampler similar to that of FIG. 2. It comprises a column of four sampling D-type flip-flops, F1A, F1B, F1C and F1D which are clocked at the four quadrature phases of the VCO (or the local recovered clock, 0°, 90°, 180°, and 270°. The second column 23 of similar flip-flops, F2A, etc., time aligns the samples to yield at the Q outputs the time aligned samples A–D. In FIG. 7 all flip-flops are clocked at 0° if not otherwise noted. The Exclusive-Or (Ex-Or) gate 25 compares the A and B samples to yield a disagreement signal, $W_n$, and the similar gate 29 yields the $X_n$ disagreements from the B and C samples. The Ex-Or gate 27 compares the B sample from the output of flip-flop F2B and the B sample of the previous data eye ($B_{n-1}$) which is obtained from the output of flip-flop F3. A binary 1 output from gate 27 thus indicates that a transition has occurred between the current and the previous time slot. These transition signals are referenced as $V_n$. The $X_n$ disagreement signals are delayed one time slot by means of flip-flop F4, the Q output of which is labeled as $X_{n-1}$.

The signal $W_n$ forms one input of AND gate 47, the other input of which is the $\overline{Q}$ output of flip-flop F7. The signal $W_n$ is inverted by inverter 35, the output of which forms one input of three-input NAND gate 37. The other inputs of gate 37 are $V_n$ and the output of inverter 39, the input of which is the $Xf_{n-1}$ disagreement signal. The output of gate 37, line 38, comprises a "not quiet" or $\overline{\text{quiet}}$ signal which forms one input of each of the AND gates 43 and 45 and it provides a control signal for tristate gate 55. The Or gate 33 has as its inputs the Q output of flip-flop F6, $W_d$, and $W_n$; and its output forms an input of gate 43. The third input of gate 43 is the $\overline{Q}$ output of flip-flop F7. Similarly the Or gate 41 has as inputs $X_{n-1}$ and $X_d$ which is the Q output of flip-flop F7. The output of gate 41 is an input of gate 45, the third input of which is the $\overline{Q}$ output of F6.

The NAND gate 49 has as its inputs, $X_{n-1}$ and the $\overline{Q}$ output of F6. The output of gate 47 comprises the aforementioned VCO pump-down or $f_{down}$ signals and the output of gate 49 the VCO pump-up or $f_{up}$ signals.

It is assumed for illustrative purposes that a bi-polar power supply is used for all circuits of FIG. 7. Such a power supply may comprise a $V_{dd}$ terminal of +5 volts and a $V_{ss}$ terminal of −5 volts with ground at zero voltage. The two MOS FET transistors Q1 and Q2 have their drain and source terminals connected in series from the positive power supply terminal $V_{dd}$ to the negative terminal $V_{ss}$, as shown. Q1 is a P-channel transistor as indicated by the arrow on the gate terminal thereof and Q2 is an N-channel transistor indicated by the oppositely-directed arrow on its gate terminal. The gate of Q1 is connected to the output of gate 49 and the gate of Q2 to the output of gate 47. The junction of the two transistors is connected to the frequency control input 53 of VCO 51 via resistor $R_f$. A capacitor C is connected from input 53 to ground. $V_c$ is the voltage at VCO input 53. The output 52 of the VCO is applied to phase shifter 61, which provides the four quadrature-phased outputs as indicated thereon. In practice a VCO, which produces the four output phases, could be employed.

The circuit thus far described utilizes the two disagreement signals $W_n$ and $X_{n-1}$ and the transition signal $V_n$ in conjunction with the logic and control circuitry to provide the $f_{up}$ and $f_{down}$ signals to the VCO. The VCO is designed so that when its control voltage, $V_c$ is zero, its frequency is approximately equal to the system synchronous frequency and that positive $V_c$ increases the VCO frequency and vice versa. Thus when the data frequency is low (VCO fast) the circuit produces positive $f_{down}$ pulses which turn on Q2 which results in current flow from ground through C and Q2 to $V_{ss}$, resulting in a negative $V_c$ and lower VCO frequency. More specifically, the output of gate 47 will normally be low (or near $V_{ss}$) so that Q2 is normally non-conducting. The $W_n$ pulses applied to gate 47 will produce a positive signal at the gate of Q2 which will render it conducting. When the data frequency is high (VCO slow) $f_{up}$ pulses will be produced by the resultant X disagreements. The output of NAND gate 49 is normally high and Q1 is thus non-conducting. Positive X disagreement pulses will cause the output of 49 to go low (or negative) and render Q1 conducting. This connects $V_{dd}$ to point $V_c$ via $R_f$ and increases $V_c$ to raise the VCO frequency.

The circuit of FIG. 7 utilizes three of the four evenly-spaced or quadrature samples to produce the two disagreement signals $W_n$ and $X_{n-1}$ and the transition signal $V_n$ and to generate the aforementioned VCO pump-up and pump-down signals. This circuitry will control the VCO frequency in response to phase or frequency error until the three sample points A–C are all located within each data eye or time slot. This is accomplished as follows: On each positive transition of the 0° clock, flip-flops F6 and F7 are clocked and since their D inputs are normally low (or binary 0) the Q outputs thereof are reset low and the $\overline{Q}$ outputs the opposite or high. These two high $\overline{Q}$ outputs of flip-flops F6 and F7 thus enable both the gates 47 and 49 so that the W or X disagreement signals can pass, to form the $f_{up}$ and $f_{down}$ signals for application to the VCO, as explained above. For example, if there is a transition-free period which permits the VCO to drift so that either a W or X disagreement exists when the first subsequent transition occurs, the disagreement signals $W_n$ will pass through gate 47 to lower the VCO frequency or $X_{n-1}$ signals will pass through gate 49 to raise the VCO frequency.

In the case of frequency error there will be periods of both X and W disagreements as the sampling points continually drift through the data eyes or windows. These periods of disagreements will be separated by quiet periods when the three samples A–C are all temporarily the data eyes. Quiet periods are defined as periods of no W or X disagreements but with transitions. Such a quiet period is illustrated in the first time slot $b_o$ of FIG. 1c which depicts the situation where the data is slow (VCO fast). In this waveform the sampling points are all drifting toward the left relative to the data. As a result of this drift the A and B samples are separated by the transition between data eyes $b_1$ and $b_2$, resulting in a W disagreement signal. If this waveform contained one or two additional data eyes the drift would produce an X disagreement as the B sample crossed a transition, as it is about to between the data eyes $b_3$ and $b_4$. Following this X disagreement there would be another quiet period, to begin the cycle anew.

The waveform of FIG. 1d shows the situation wherein the data is fast (VCO slow) with the data eye $b_o$ again a quiet period. This results in a drift to the right of the sampling points, with the initial or leading-edge disagreement occurring between data eyes $b_4$ and $b_5$, wherein the B and C sample points are separated by a transition to yield an X disagreement as the B sampling point crosses a transition.

Thus when the clock or VCO is fast, the leading-edge disagreements are W disagreements which are arranged to produce pump-down signals to the VCO for correction of the fast VCO. Conversely, when the VCO is slow, the leading-edge disagreements are of the X type which are arranged to produce pump-up signals to raise the VCO frequency. In both cases the undesired trailing-edge or opposite type disagreements must be suppressed. The foregoing also shows that the leading-edge disagreements are the proper ones for achieving VCO frequency correction.

The circuit of FIG. 7 functions to achieve frequency lock as follows: The NAND gate 37 output, line 38, labeled as $\overline{quiet}$ is high during non-quiet periods and low during quiet periods. If there are transitions but no W or X disagreements, $V_n$ will be high and the outputs of inverters 35 and 39 will also be high. Thus the output 38 of gate 37 will be low and as a result the outputs of both AND gates 43 and 45 will also be low. Thus both flip-flops F6 and F7 will have low D inputs and low Q outputs. This primes the circuit for the subsequent leading-edge disagreements. The first subsequent disagreement to occur will change the output of its inverter, 35 or 39, from high to low, thus switching the output of gate 37 from low to high. Such a leading-edge disagreement, if a W type, will pass through Or gate 33 to provide a high input to gate 43. The high $\overline{Q}$ output from flip-flop F7 provides a third high input to gate 43, thus applying a high input to the D terminal of flip-flop F6. The clock will thus set flip-flop F6 so that its Q output is high and $\overline{Q}$ low. The Q output forms a latch signal $W_d$ which is fed back to gate 43 via gate 33 to maintain flip-flop F6 set until the next quiet period occurs. With flip-flop F6 set, the low $\overline{Q}$ output thereof, which forms one input of gate 49, locks out the trailing-edge X disagreements until the next quiet period occurs. The low $\overline{Q}$ output of flip-flop F6 also prevents subsequent X disagreements from setting flip-flop F7 via gate 45 until the next quiet period occurs. The leading-edge disagreements W are then passed by gate 47 to produce $f_{down}$ signals for application to the VCO as previously described. If the leading-edge disagreements had been of the X type, flip-flop F7 would have been set through gates 41 and 45 and the latching signal $X_d$ would have latched this circuit in the set state, with the gate 47 locked out by the low $\overline{Q}$ signal applied thereto from flip-flop F7. This would permit the X disagreements to pass through gate 49 to produce $f_{up}$ signals to the VCO. As stated above, the circuit may pass through several cycles of leading-edge disagreements separated by quiet intervals before frequency lock is achieved. When no more W or X disagreements occur, it means that the sampling points A–C are all within the data eyes, but as stated above, this can permit some residual phase error.

Figure 8:
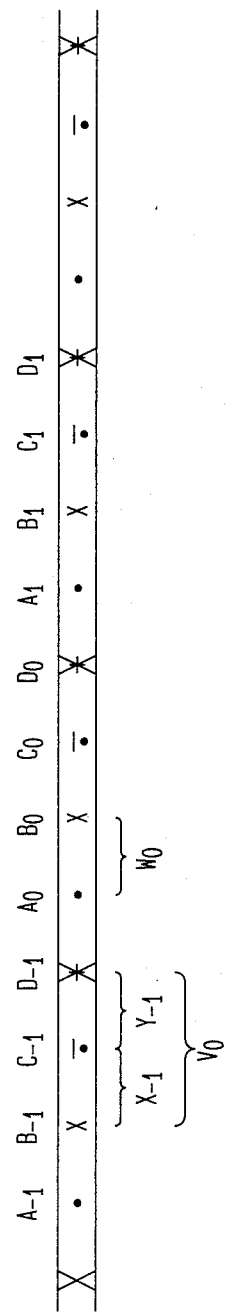
FIGS. 8, 9 and 10 are waveforms illustrating the operation of the circuit of FIG. 7.

In accordance with a further feature of my invention, Y disagreements resulting when the C and D samples are on opposite sides of a transition are used to provide phase early and phase late signals which provide either a positive or negative voltage to the capacitor C, to provide a fine phase adjustment so that the sampling point B will be approximately centered within each data eye. The C and D time-aligned samples from flip-flops F2C and F2D are applied to Ex-Or gate 31 which yields the disagreement signal $Y_n$ 'which is passed through delay flip-flop F5 to yield disagreement signal $Y_{n-1}$. The signal $Y_{n-1}$ is applied to the tri-state or transmission gate 55, the control input of which is the inverted quiet signal from line 38. Thus the gate 55 is enabled and will pass the $Y_{n-1}$ signal during all quiet periods. $Y_{n-1}$ will be high (or positive) during Y disagreements when the C and D sample points are on opposite sides of a transition and will be low or negative when the C and D points are on the same side of a transition. FIG. 8 shows how this fine phase adjustment works. If there are no W or X disagreements and there are transitions, it indicates that the samples A–C are all within the data eyes as shown in FIG. 8. FIG. 8 shows a situation of perfect frequency and phase alignment with the D sample point at the transitions and hence the B sample point 180° to the left thereof in the middle of the data eye. If, however, the D sample point drifts slightly to the right due to an early data transition, a Y disagreement will occur and the $Y_{n-1}$ 'positive signals will pass gate 55 to form a phase early signal which is applied to the VCO control input through R$\phi$ to raise $V_c$, thus increasing the VCO frequency. This moves the D sample point to the left toward the transitions and perfect synchronization. If the transitions cease, line 38 will go high and gate 55 will be disabled and no voltage will be transmitted therethrough, so that the output of gate 55 will assume the voltage $V_c$ and no control action will result. If the D sampling point is to the left of the transitions due to a late data transition, the signal $Y_{n-1}$ will be low or negative and during quiet periods this negative voltage will form a data phase late signal which is applied through gate 55 and R$\phi$ to the VCO control input to decrease $V_c$ and thus lower the VCO frequency . . . so that the D sample moves to the right toward the transitions.

If the circuit is used to recover an NRZ signal clock which is then used to clock the data into a FIFO, the centered B sample which is the 90° phase of the VCO would be used to clock the data stream into the FIFO, since this signal is nominally sampled at the center of the eye where the maximum noise margin exists. The scrambling pattern would be arranged to provide sufficient transitions to prevent the B sample from drifting out of its data eye.

Figure 9:
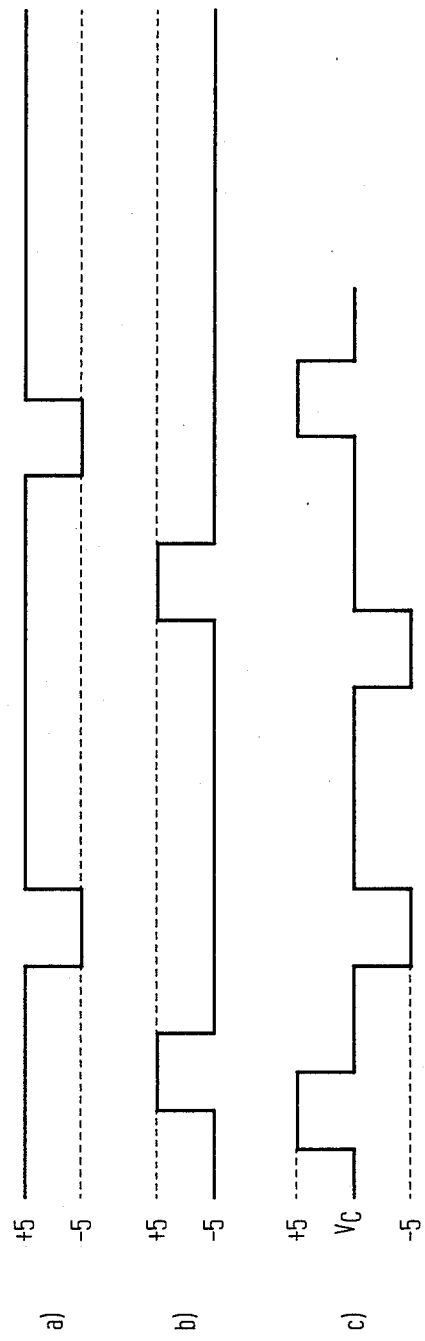

FIG. 9a shows the $f_{up}$ or pump-up pulses produced by NAND gate 49 in response to the X disagreements. The high or +5 voltage levels indicates the absence of X disagreements and the low or −5 volt levels are the periods of the X disagreements, which render transistor Q1 conductive to charge capacitor C and raise the VCO frequency. FIG. 9b shows the $f_{down}$ or pump-down signals applied to gate 47, the low or −5 levels representing the absence of the W disagreements with the high or +5 volt levels representing W disagreements which are passed by gate 47 to render transistor Q2 conductive to lower $V_c$ and thus lower the VCO frequency. FIG. 9c shows the phase early and phase late signals at the output of gate 55. The high or +5 voltage levels indicate a Y disagreement which increases the VCO frequency. The low or −5 voltage levels indicate the absence of Y disagreements which lower the VCO frequency. The intermediate or $V_c$ levels indicate non-quiet periods when gate 55 is disabled.

Figure 10:
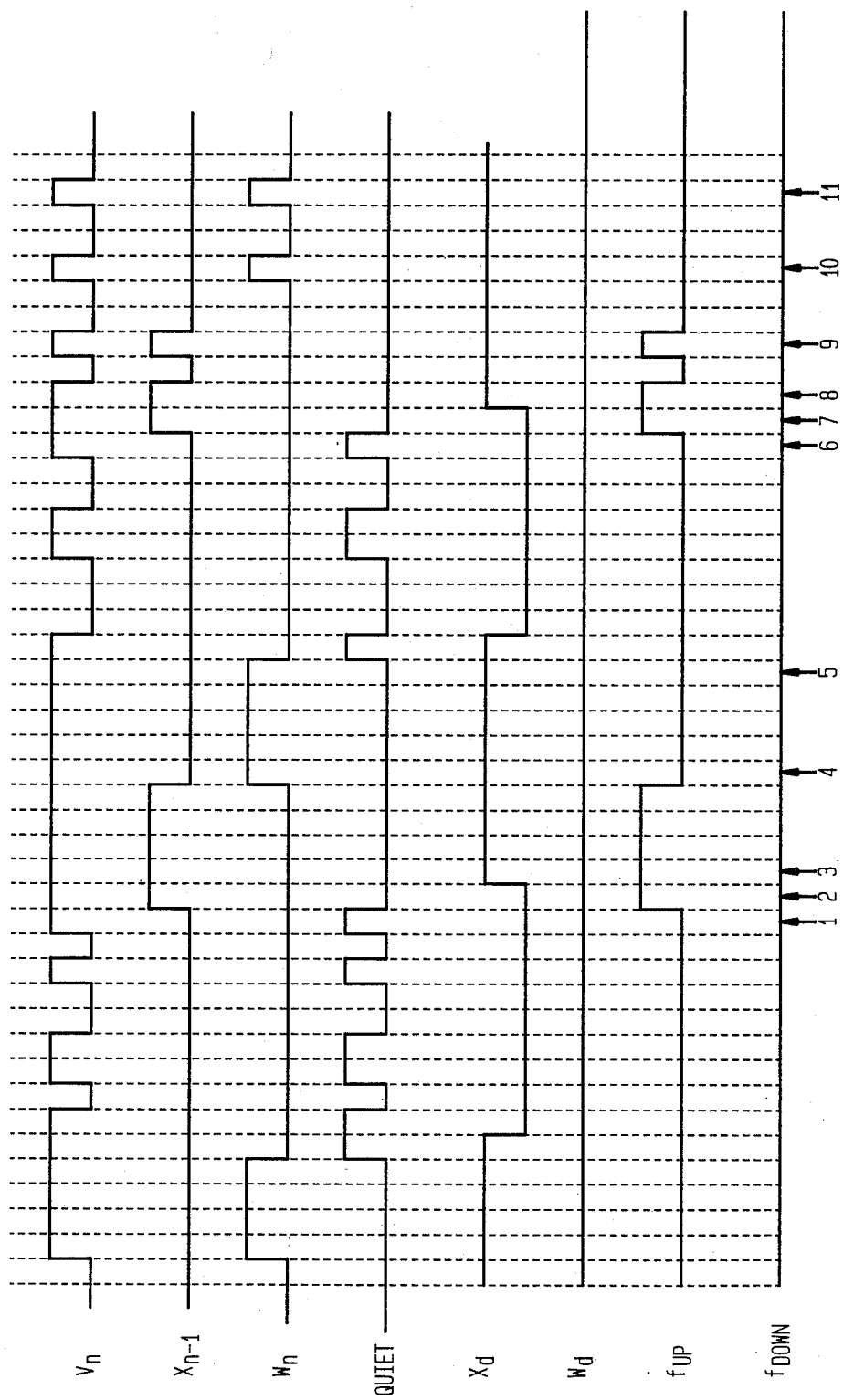

FIG. 10 shows typical waveforms for the circuit of FIG. 7 for an arbitrary data sequence, which is not shown. However, the disagreement signals $X_{n-1}$, $W_n$ and the transition signals $V_n$ caused by the data sequence are shown, as well as the clock periods indicated by the vertical dashed lines. Several of the significant clock periods are numbered at the bottom of this figure. The Quiet waveform is the inverse of the output of gate 37 of FIG. 7 and the $W_d$ and $X_d$ waveforms are the outputs of flip-flops F6 and F7 of the same figure. The $f_{up}$ and $f_{down}$ signals are the outputs of gates 49 and 47, respectively.

It can be seen that clock period 1 is a quiet period during which there are transitions ($V_n=1$) and no X or W disagreements ($X_{n-1}=W_n=0$). The following clock period, 2, shows that the leading-edge disagreement is $X_{n-1}$, and it is composed of five adjacent pulses which are passed by gate 49 as $f_{up}$ signals. On the next clock pulse, 3, the flip-flop F7 will be triggered so that its Q output, $X_d$, will be high, latching flip-flop F7 through gate 41 and locking out gate 47 through the connection of the $\overline{Q}$ output of flip-flop F7 to 47. Thus the subsequent five $W_n$ disagreement signals of clock pulses 4 through 5 will not be passed by gate 47 and no $f_{down}$ pulses will be applied to the VCO. The next quiet period with subsequent disagreement signals occurs in clock period 6, and the two X disagreements of clock periods 7 and 8 form $f_{up}$ signals. Also note that the $X_d$ and $W_d$ signals remain in effect until the next quiet period resets both flip-flops F6 and F7, so that the X disagreement signal of clock period 9 becomes an $f_{up}$ pulse, while the subsequent W disagreements of clock periods 10 and 11 are suppressed since flip-flop F6 is still set with its $\overline{Q}$ output low.

Obvious variations in this circuitry will occur to those skilled in this art. For example, if extreme phase accuracy is not required the fine phase control feature could be eliminated. Also, it should be recognized that the choice of other sample points within the data eye can be made. Furthermore, the descriptions of the VCO and its control circuit to the right of dashed line 56 in FIG. 7 comprise only one of many ways in which the novel phase and frequency detector can be employed in forming a phase frequency locked loop. For example, the frequency control element could be a fully digital counter-type circuit instead of the conventional VCO employing analog voltage control. The term "local frequency source" as used herein is intended to encompass any of these types of controllable oscillators, including VCOs, purely digital types, or combinations thereof. Accordingly, the invention should be limited only by the scope of the appended claims.

What is claimed is:

1. A digital phase/frequency locked loop circuit comprising a phase and frequency detector the output of which controls the frequency of a local frequency source, said detector comprising means to sample a phase-varying data stream applied thereto at three sampling points or phases of said local frequency source, means for generating first and second disagreement signals from comparisons of different pairs of said three samples, said disagreement signals being in an active state when the pair of samples being compared are in different logic states, and means to generate a binary signal, V, indicating the presence or absence of transitions in said data stream, said detector further comprising digital logic circuitry for generating during period of phase error frequency pump-up signals for application to said local frequency source in response to said first disagreement signals, and to generate frequency pump-down signals for application to said local frequency source in response to said second disagreement signals, means to generate quiet period signal from said signal V and from said first and second disagreement signal for identifying as quiet periods those periods during which there is at least one data transition and during which neither said first or second binary disagreement signals are in an active state, means for identifying as leading-edge disagreements those first or second binary disagreement signals which enter an active state immediately after a quiet period and continuing until a binary disagreement signal of the opposite type enters the active state, and means to correct frequency error of said local frequency source by generating frequency pump-up signals for application to said local frequency source in response to leading-edge disagreement signals originating from said first binary disagreement signals and by generating frequency pump-down signals for application to said local frequency source in response to leading-edge disagreement signals originating from said second binary disagreement signals.

2. The circuit of claim 1 wherein said detector further comprises means to generate third disagreement signals from said third sample and a fourth sample, and means to apply said third disagreement signals to said local frequency source as fine phase adjustment signals during said quiet periods.

3. The circuit of claim 1 wherein said three sampling points are at 0°, 90° and 180° of said local frequency source.

4. The circuit of claim 2 wherein said four sampling points are at 0°, 90°, 180° and 270° of said local frequency source.

5. The circuit of claim 1, wherein said local frequency source is a voltage controlled oscillator.

6. A circuit for recovering the clock from a phase-varying non-return-to-zero data stream, comprising a voltage controlled oscillator (VCO) which is phase/frequency locked to the clock of said data stream by means of a phase and frequency detector to which said data stream is connected and which controls the frequency of said VCO, said detector comprising digital logic means to sample the said data stream at multiple phases of said VCO and to produce one of two different disagreement signals depending on the sense of the phase error between said VCO and said data stream, and means to achieve phase lock by applying said disagreement signals to said VCO, means to generate a signal identifying as quiet periods those periods during which there is at least one data transition and during which neither said first or second binary disagreement signals are produced, means for identifying as leading-edge disagreement signals those first or seocnd binary disagreement signals occurring immediately after a quiet period and continuing until binary disagreement signals of the opposite type occur, means to apply said leading-edge disagreement signals to said VCO during periods of frequency error to control the frequency thereof in such a way as to eliminate said frequency error, and said detector further comprising means to produce a third binary disagreement signal which is applied to said VCO as a phase early or phase late fine phase control signal.

7. The circuit of claim 6 where in said multiple phases of said VCO are at 0, 90, 180, and 270 degrees corresponding to samples A, B, C and D and wherein said two different disagreement signals are produced respectively by an Exclusive-Or function of the said a and B samples and of said B and C samples, and wherein said third binary disagreement signal is produced by the Exclusive-Or function of the said C and D samples.

8. A phase and frequency detector, the output of which controls the frequency of a voltage controlled oscillator (VCO) so that VCO becomes locked in frequency and phase to a phase-varying input signal, said detector comprising means to sample said phase-varying signal at four phases of said VCO to produce first, second, third and fourth samples, means for producing first and second disagreement signals from two pair-wise comparisons among three of said four samples, said disagreement signals being in an active state when the pair of samples producing the disagreement signal are in opposite logic states, means to apply the active one of said disagreement signals to said VCO to correct the frequency thereof during periods of phase error, means for identifying as a leading-edge disagreement signal that first or second disagreement signal which enters an active state immediately after a quiet period and continues until a disagreement signal of the opposite type enters the active state, a quiet period being a period in which there is at least one transition in the input signal and neither said first or second disagreement signals are active, and means to apply said lead-edge disagreement signal to said VCO to correct the frequency thereof during periods of frequency error between said phase-varying input signal and said VCO.

9. A circuit comprising a phase and frequency detector and a voltage controlled oscillator (VCO) controlled thereby so that said VCO will become locked in frequency and phase to a data signal applied to the input of said detector, said detector comprising a quartet sampler comprising means to obtain and time-align four samples of said data signal at four different phases (A, B, C and D) of said VCO, digital means to generate two disagreement signals (W and X) from said A, B and C samples and means to generate a transition signal, V, from the current B sample and the B sample of the previous data time slot or eye, and digital logic circuitry to which said W, X and V signals are applied, said logic circuitry comprising means to generate $f_{up}$ or $f_{down}$ signals which are applied to the frequency control element of said VCO to adjust the frequency thereof so that the positive-going transitions of said A, B and C samples are all within the same data time slot or eye.

10. The circuit of claim 9, further comprising a fine phase control means which utilizes a third disagreement signal, Y, which is generated by an Exclusive-Or function of said C and D samples from the output of said quartet sampler, said Y signal generating phase early and phase late bi-polar signals which are applied to the said frequency control element of said VCO to adjust the frequency thereof in such a way that the positive-going transitions of said D samples are located at or near each transition of said data signal.

11. The circuit of claim 9 wherein said different phases of said VCO are 0, 90, 180, and 270 degrees and wherein said digital logic circuit comprises means which function during periods of frequency error to select the first or leading-edge disagreement signal to occur following each quiet period for application to said frequency control element of said VCO, quiet periods being defined as periods of transitions ($V=1$) and no W or X disagreements ($W=X=0$).

12. A circuit comprising a phase and frequency detector the output of which controls the frequency of a voltage controlled oscillator (VCO), comprising
means to generate samples of an applied non return to zero digital data stream at four sampling points or phases (A, B, C and D) of said VCO and means for generating two binary disagreement signals from different pairs of three of said samples which are adjacent (e.g. A, B and C), said disagreement signals being in an active state when the pair of samples which generate the disagreement signal are in different logic states, said detector further comprising means to generate a binary signal (V) indicating the presence or absence of data transitions in said appolied data stream, said detector further comprising digital logic circuitry for generating frequency pump-up signals for application to said VCO in response to one of said disagreement signals and for generating frequency pump-down signals for application to said VCO in response to the other type of disagreement signal, and
said detector further comprising means to correct frequency error of said VCO by means of logic circuitry which detects a leading-edge disagreement signal which follows each quiet period, a quiet period being a period in which there is at least one data transition and neither of said binary disagreement signals is in an active state, a leading-edge disagreement signal being that disagreement signals which enters an active state immediately after quiet period and continues until a disagreement signal of the opposite type enters the active state, said logic circuitry comprising means for generating said frequency pump-up or pump-down signals from said leading-edge disgreement signals.

13. The circuit of claim 12 further comprising a fine phase control circuit comprising means to generate a third disagreement signal from two of said samples and means to apply said third disagreement signal to said VCO during said quiet periods, so as to adjust the phase of said VCO so that one of said sample points will be located at or near all of the transitions in said data stream.

14. A phase and frequency detector to which a phase-varying non-return-to-zero digital data signal and a local clock signal are applied and comprising
means to obtain samples of said phase-varying signal at multiple phases of said local clock signal, and digital logic circuitry for producing one of two disagreement signals from three of said samples if there is phase or frequency error, said disagreement signals being in an active state when the samples that form the disagreement signal are in different logic states,
said logic circuitry comprising means to select during periods of frequency error a leading-edge type of disagreement signal which follows each quiet period a quiet period being a period in which there is at least one transition in the data signal and neither of said disagreement signals is in an active state, a leading-edge disagreement signal being that one of the two disagreement signals which enters an active state immediately after a quiet period and that continues until the opposite one of the disagreement signals enters the active state, the said leading-edge disagreement signals being applied to the output of the phase and frequency detector.

15. A phase and frequency detector to which an incoming data stream and a local clock signal are applied and comprising
means for sampling the incoming data stream at multiple phase of the local clock,
means for producing two disagreement signals from pairs of said samples, each disagreement signal being in an active state if its associated pair of samples are in opposite logic states,
means to achieve phase lock by applying said disagreement signals to the local clock, and
means during periods of frequency error to select leading-edge type of disagreement signals to adjust the frequency of the local clock, a quiet period being a period in which there is at least one transition in the data stream and neither of said disagreement signals is in an active state, and a leading-edge type of disagreement signal being that one of the two disagreement signals that enters an active state immediately after a quiet period and that continues until the other of the two disagreement signals enters the active state, and to suppress those disagreement signals which enter the active state after leading-edge type of disagreement signals and which are of a kind opposite to that which were the leading edge disagreement signals, whereby said leading-edge disagreement signals drive the local clock toward phase lock.

* * * * *